United States Patent
Wang et al.

(10) Patent No.: US 11,304,326 B2
(45) Date of Patent: Apr. 12, 2022

(54) ELECTRONIC DEVICE HAVING ELECTRONIC COMPONENTS CONNECTED WITH EACH OTHER WITHOUT GAPS

(71) Applicant: HONGFUJIN PRECISION ELECTRONICS(TIANJIN) CO., LTD., Tianjin (CN)

(72) Inventors: Wen-Chen Wang, New Taipei (TW); Nan-Chieh Wang, New Taipei (TW)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 78 days.

(21) Appl. No.: 16/919,424

(22) Filed: Jul. 2, 2020

(65) Prior Publication Data
US 2021/0360813 A1 Nov. 18, 2021

(30) Foreign Application Priority Data

May 14, 2020 (CN) .......................... 202010409508.2

(51) Int. Cl.
*H05K 7/14* (2006.01)
*H05K 5/02* (2006.01)

(52) U.S. Cl.
CPC ........... *H05K 7/1411* (2013.01); *H05K 5/023* (2013.01)

(58) Field of Classification Search
None
See application file for complete search history.

(56) References Cited

U.S. PATENT DOCUMENTS

| | | | |
|---|---|---|---|
| 4,991,818 A * | 2/1991 | Darbo | H05K 7/1411 248/681 |
| 7,256,992 B1 * | 8/2007 | Stewart | G06F 1/20 165/80.3 |
| 7,354,293 B2 * | 4/2008 | Liang | H05K 7/1411 361/727 |
| 9,992,896 B2 * | 6/2018 | Fordham | G06F 1/186 |
| 2012/0320521 A1 * | 12/2012 | Gong | G11B 33/124 361/679.38 |
| 2014/0185247 A1 * | 7/2014 | Dittus | H05K 7/1409 361/728 |
| 2014/0254106 A1 * | 9/2014 | Baquiano | H05K 5/0221 361/726 |

* cited by examiner

*Primary Examiner* — James Wu
*Assistant Examiner* — Christopher L Augustin
(74) *Attorney, Agent, or Firm* — ScienBiziP, P.C.

(57) ABSTRACT

An electronic device includes a housing, a first electronic component, a second electronic component, two resilient assemblies, and two rotating levers. The housing defines an accommodating space. The second electronic component is fixed in the accommodating space. Each rotating lever includes a first end and a second end. A distance between the second end and a rotation shaft is less than a distance between the first end and the rotation shaft. A handle is rotationally fixed on the first electronic component. When the first electronic component slides into the accommodating space, the handle is rotated toward the first electronic component, the handle drives the two rotating levers to rotate and resist against the resilient assemblies, and the handle overcomes an elastic force applied by the resilient assemblies onto the rotating levers, so that the first electronic component connects with the second electronic component without gaps.

16 Claims, 7 Drawing Sheets

ELECTRONIC DEVICE HAVING ELECTRONIC COMPONENTS CONNECTED WITH EACH OTHER WITHOUT GAPS

FIELD

The subject matter herein generally relates to electronic devices, and more particularly to an electronic device with two electronic components connected together without gaps.

BACKGROUND

Electronic devices include multiple electronic components that need to be connected. In order to prevent movement of the electronic components, a first electronic component is generally fixed to the housing of the electronic device by a buckle, and since the position of the buckle has manufacturing tolerances, the first electronic component cannot connect to a second electronic component without gaps as desired.

BRIEF DESCRIPTION OF THE DRAWINGS

Implementations of the present disclosure will now be described, by way of embodiments, with reference to the attached figures.

DETAILED DESCRIPTION

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

FIGS. 1-4 show an embodiment of an electronic device 100. The electronic device 100 includes a housing 20, a first electronic component 30, a second electronic component 40, at least one resilient assembly 50, and at least one rotating lever 70. When the first electronic component 30 moves toward the second electronic component 40, the first electronic component 30 connects to the at least one rotating lever 70 and overcomes a force of the at least one resilient assembly 50 acting on the at least one rotating lever 70, which causes the first electronic component 30 to be arranged in the housing 20 and tightly connected to the second electronic component 40. In one embodiment, the first electronic component 30 is a graphics chip, and the second electronic component 40 is a bridge connection board.

The housing 20 defines an accommodating space 22 for accommodating the first electronic component 30 and the second electronic component 40. The first electronic component 30 is slidable in the accommodating space 22. The second electronic component 40 is fixed in the accommodating space 22. The first electronic component 30 can move toward the second electronic component 40 to connect to the second electronic component 40. The at least one resilient assembly 50 is fixed on the housing 20. The at least one rotating lever 70 is connected to the at least one resilient assembly 50 and rotationally fixed on the housing 20 through a rotation shaft 80. The rotating lever 70 includes a first end adjacent to the second electronic component 40 and a second end opposite the first end and away from the second electronic component 40. For example, the distance from the first end to the rotation shaft 80 is ten times the distance from the second end to the rotation shaft 80. The distance from the second end to the rotation shaft 80 is less than the distance from the first end to the rotation shaft 80. A handle 42 is rotationally fixed to an end of the first electronic component 30 away from the second electronic component 40. When the first electronic component 30 slides into the accommodating space 22, the handle 42 connects with the at least one rotating lever 70. When the handle 42 rotates toward the first electronic component 30, the handle 42 drives the rotating lever 70 to rotate and press the resilient assembly 50. The handle 42 overcomes the resistance force of the resilient assembly 50 applied on the rotating lever 70 to cause the first electronic component 30 to connect to the second electronic component 40 without a gap.

Specifically, the housing 20 includes a bearing plate 24, a top plate 26, and two oppositely disposed side plates 28 fixed between the bearing plate 24 and the top plate 26. The bearing plate 24, the top plate 26, and the two side plates 28 together define the accommodating space 22. The first electronic component 30 and the second electronic component 40 are disposed between the top plate 26 and the bearing plate 24.

Figure 1:
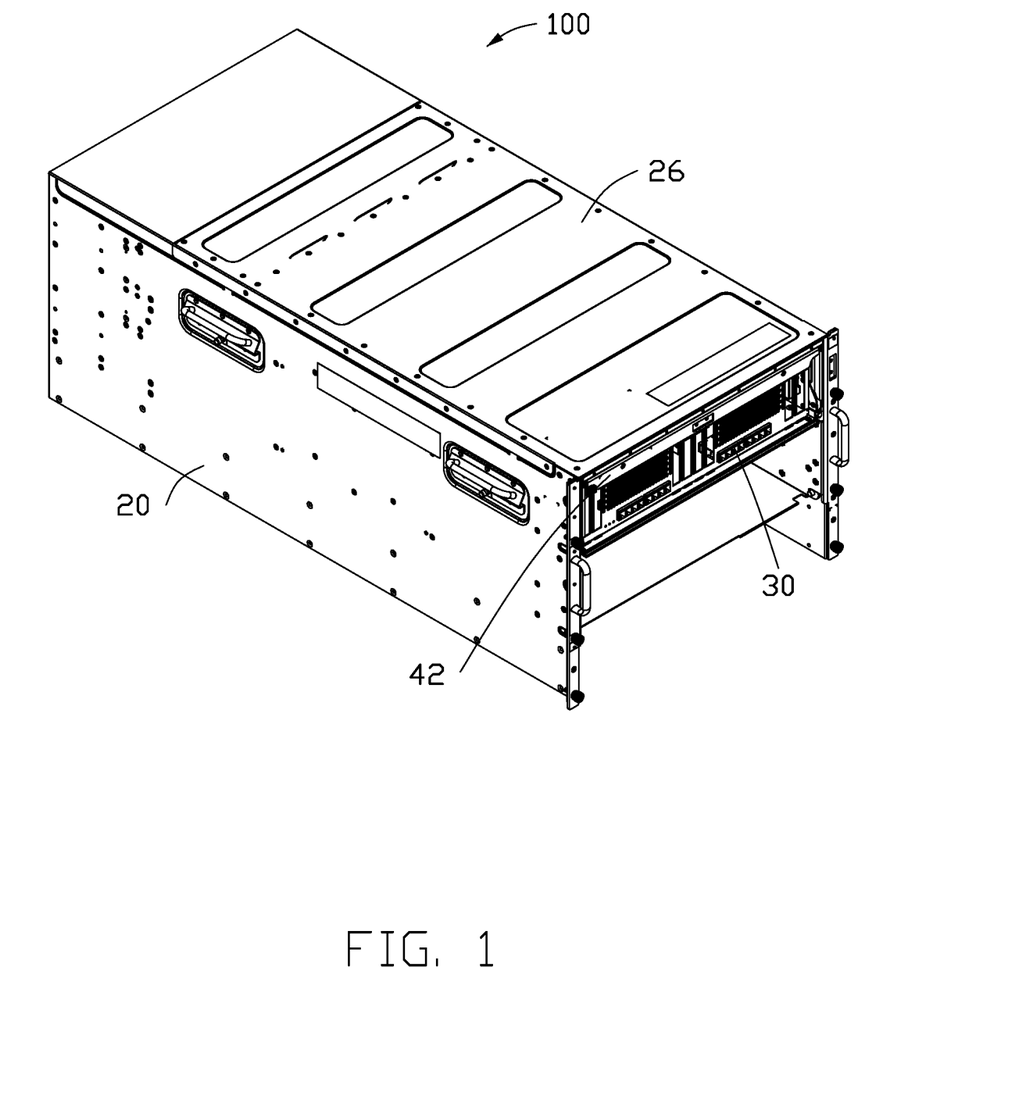
FIG. 1 is a perspective view of an electronic device.
Figure 2:
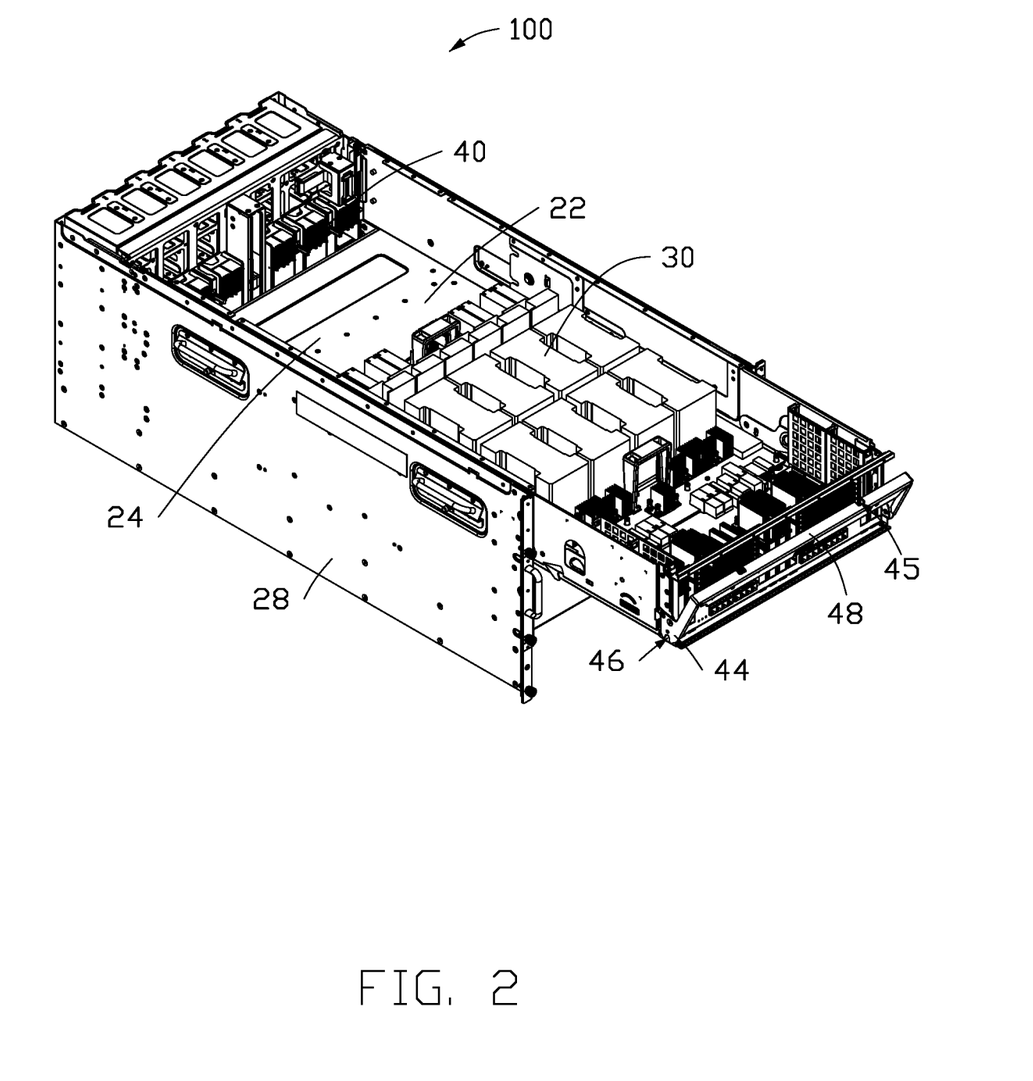
FIG. 2 is a schematic diagram of the electronic device in FIG. 1 with a top plate removed and a first electronic component not connected to a second electronic component.
Figure 3:
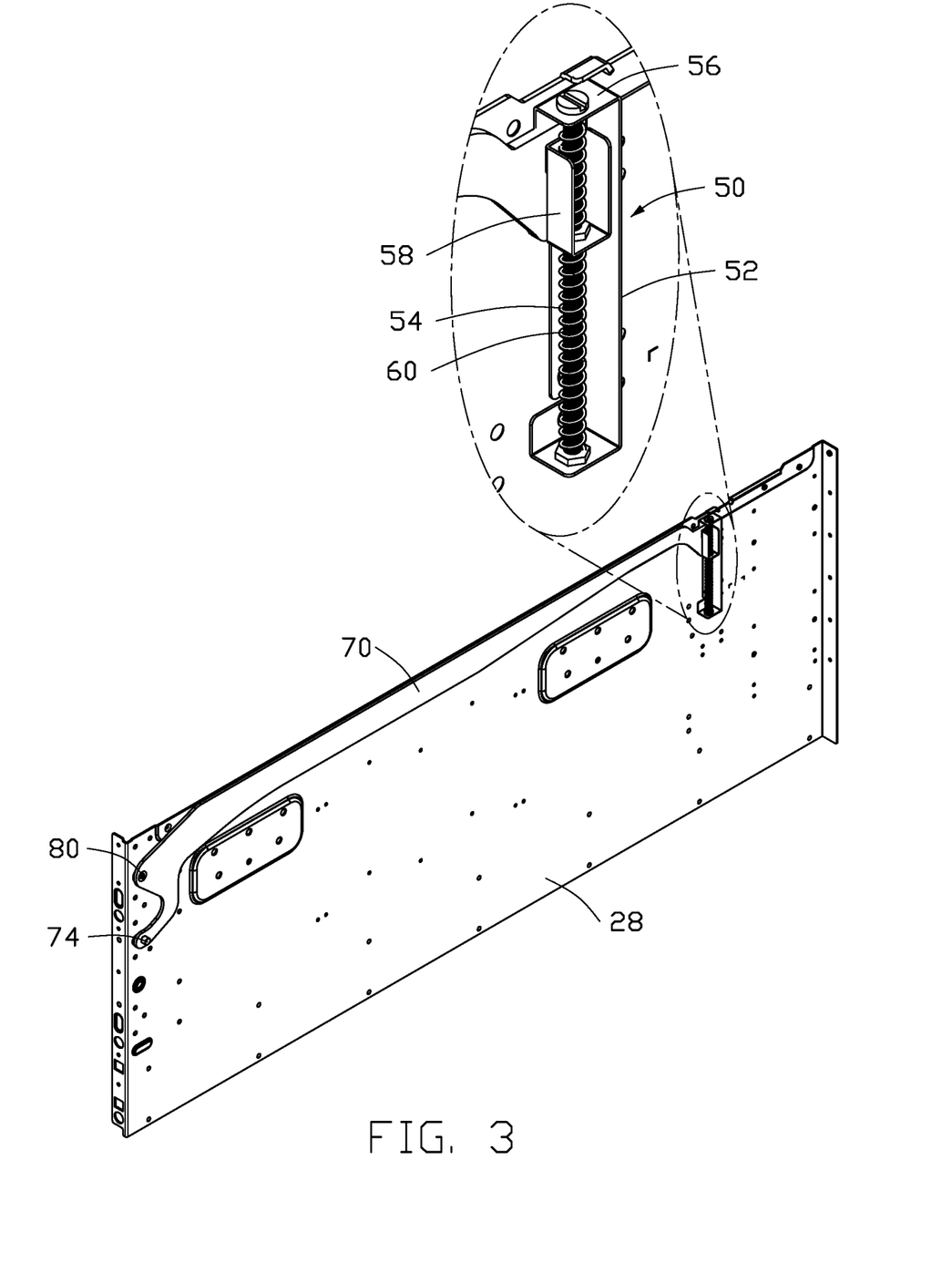
FIG. 3 is a perspective view of a part of a housing in FIG. 2.
Figure 4:
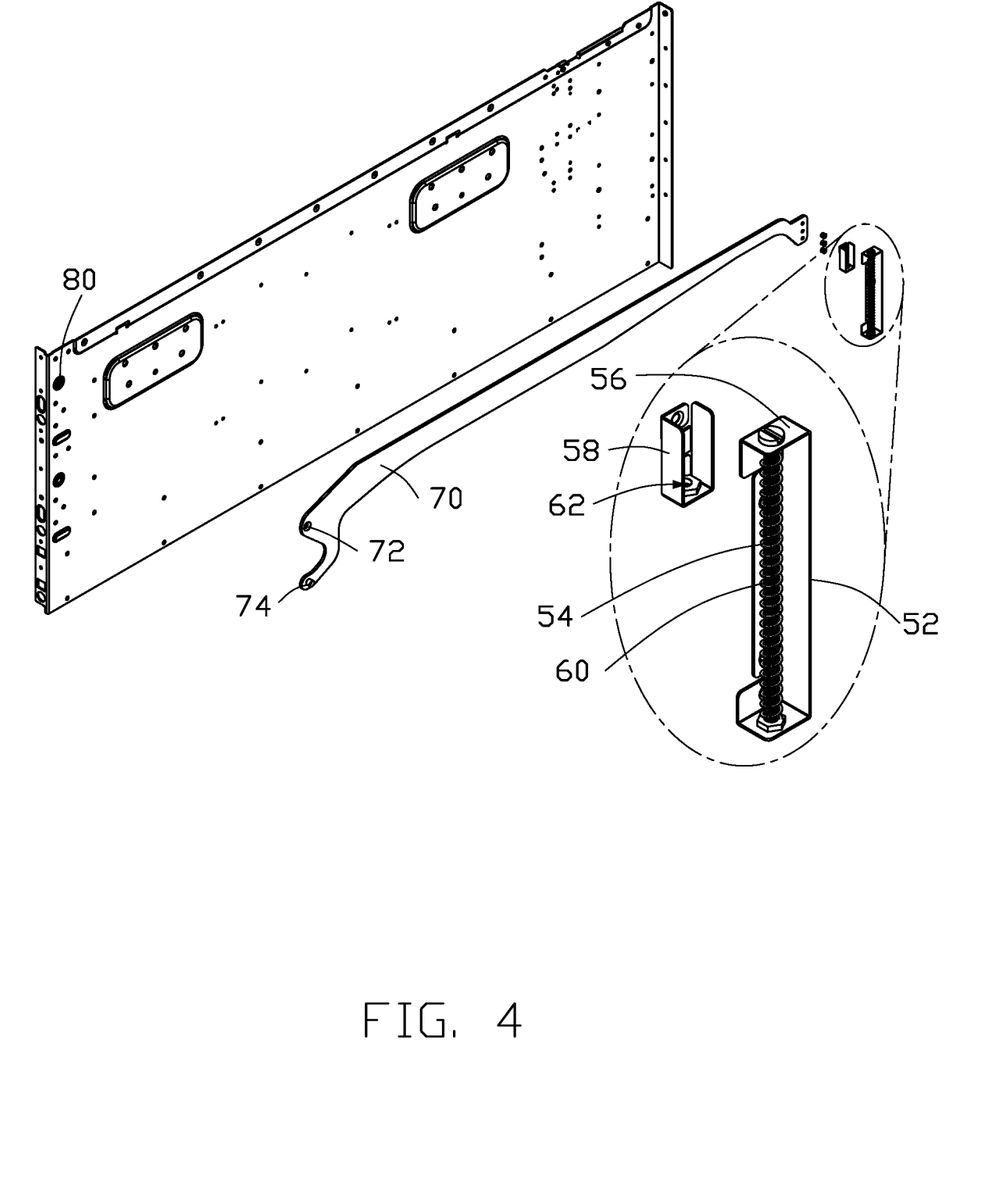
FIG. 4 is an exploded view of FIG. 3.

The electronic device 100 includes two rotating levers 70 and two resilient assemblies 50. The two resilient assemblies 50 and the two rotating levers 70 are connected to the two side plates 28, respectively. It can be understood that, in another embodiment, the two resilient assemblies 50 may be fixed on the bearing plate 24. The first end of the rotating lever 70 resists the resilient assembly 50. In one embodiment, the resilient assembly 50 includes a fixing member 52 and a resilient member 54 fixed on the side plate 28. The fixing member 52 includes two fixing pieces 56 spaced apart. The resilient member 54 is fixed between the two fixing pieces 56. A resisting member 58 is fixed to the first end of the rotating lever 70, and the resisting member 58 resists the resilient member 54. In one embodiment, the resilient member 54 is a coil spring, and the resisting member 58 resists a portion of the coil spring between two ends of the coil spring. The resilient assembly 50 further includes a guide post 60. The guide post 60 is fixed between the two fixing pieces 56, and the resilient member 54 is sleeved on the guide post 60. The resisting member 58 defines a through hole 62. A diameter of the through hole 62 is larger than a diameter of the guide post 60. Thus, due to a gap between the resisting member 58 and the guide post 60, the resisting member 58 moves along the guide post 60 when the rotating lever 70 rotates.

A shaft hole 72 is defined at the second end. The rotation shaft 80 perpendicularly protrudes from the side plate 28. The rotation shaft 80 is inserted through the shaft hole 72 and clinched by tool equipment to stamp the rotation lever 70 on the shaft 80. Thus, the rotating lever 70 is rotatable about the rotation shaft 80. The second end includes a connecting shaft 74, and the handle 42 includes two connecting portions 44 facing the two side plates 28, respectively. Each of the two connecting portions 44 defines a notch 46.

Figure 5:
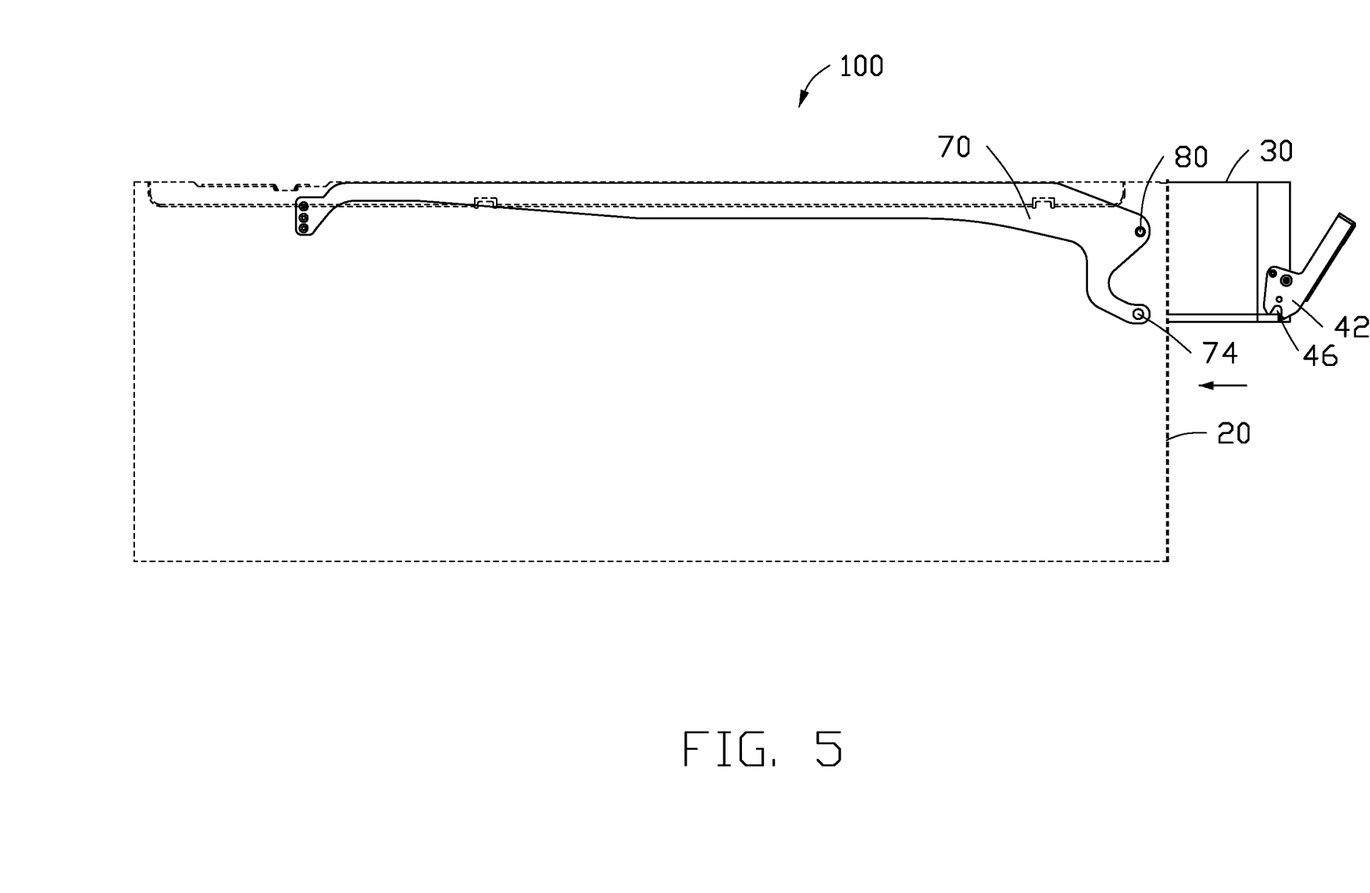
FIG. 5 is a cross-sectional view of a handle and a rotating rod in FIG. 3.
Figure 6:
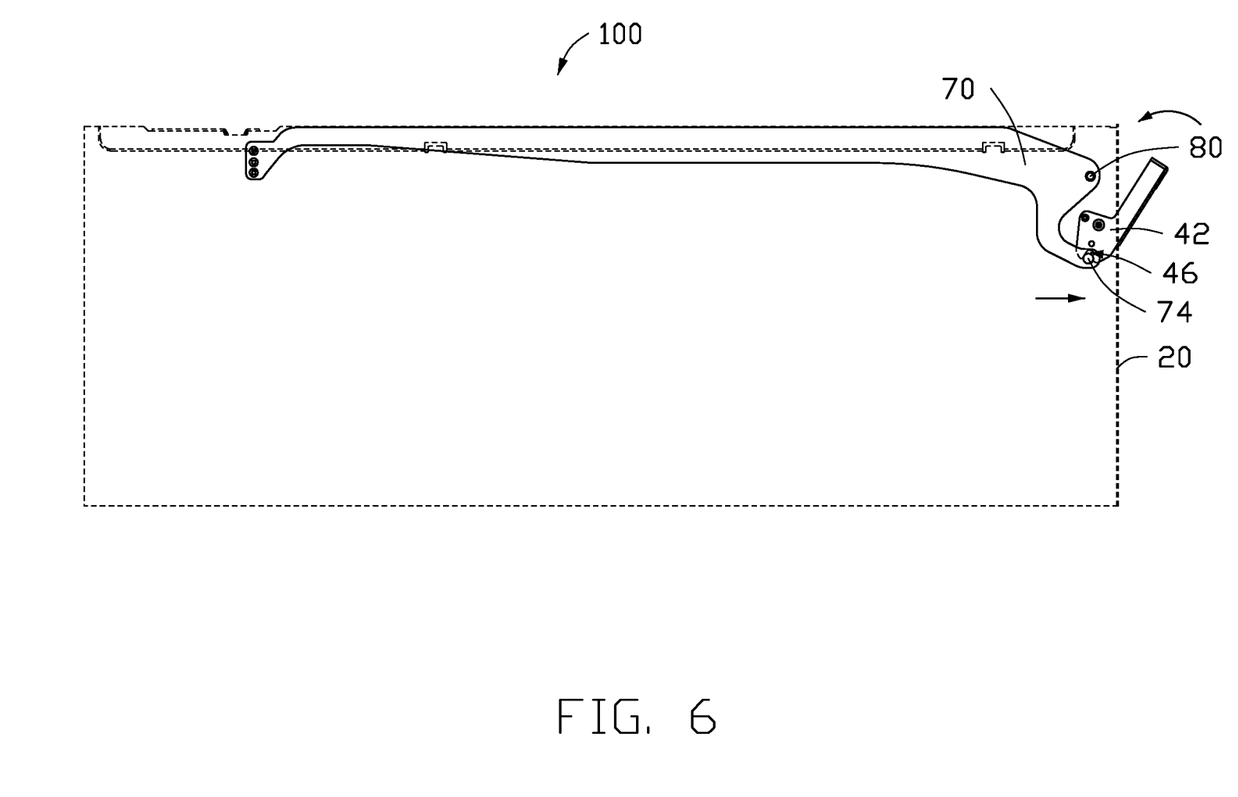
FIG. 6 is similar to FIG. 5, but showing the handle connected with the rotating rod.

Referring to FIG. 5 and FIG. 6, when the handle 42 rotates and pushes the end of the first electronic component 30 located away from the second electronic component 40 and outside the accommodating space 22 until the first electronic component 30 slides and the notch 46 is opposite the connecting shaft 74, the notch 46 accommodates the connecting shaft 74 to cause the connecting portion 44 to resist against the connecting shaft 74.

Figure 7:
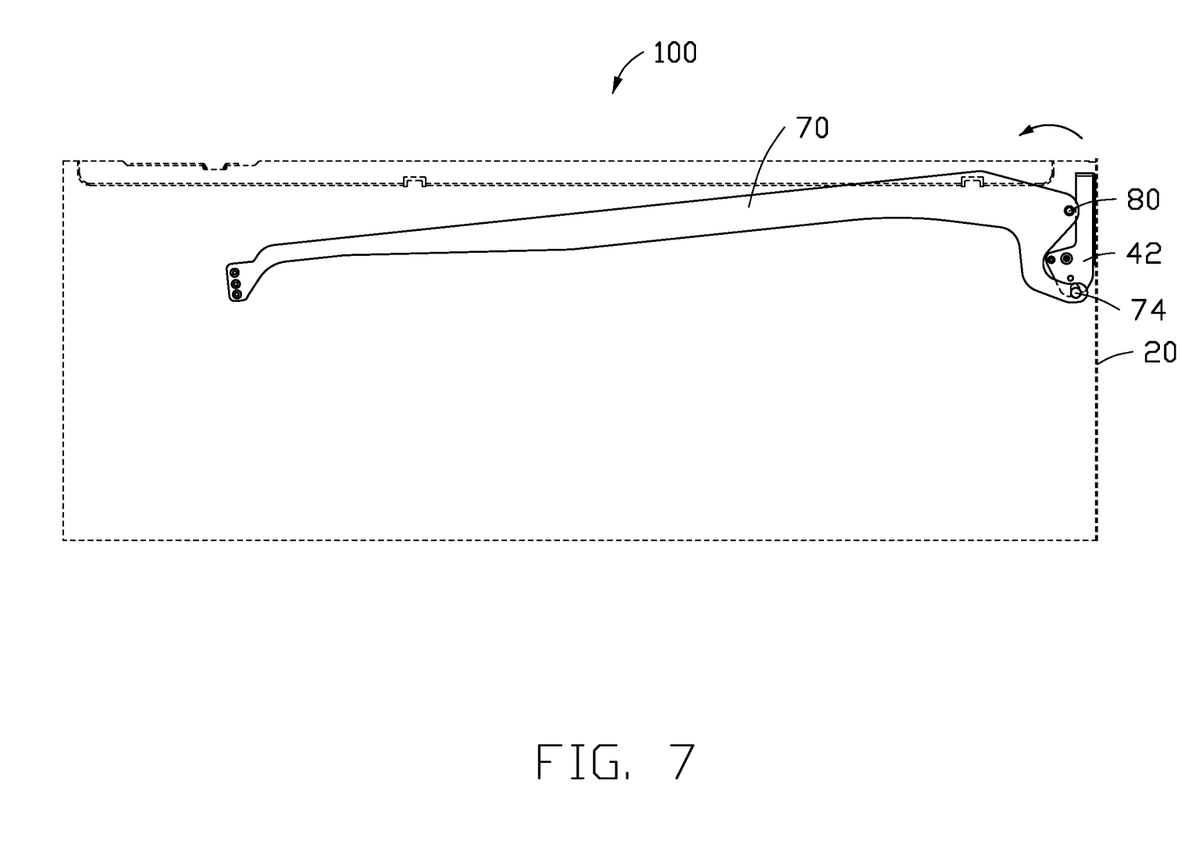
FIG. 7 is similar to FIG. 6, but showing the handle and the rotating rod when the first electronic component is connected to the second electronic component without gaps.

Referring to FIG. 7, when the connecting portion 44 resists against the connecting shaft 74 and the handle 42 is rotated toward the first electronic component 30, the connecting portion 44 drives the connecting shaft 74 to move to cause the rotating lever 70 to rotate in a first direction relative to the housing 20. The first end moves toward the bearing plate 24 when the rotating lever 70 rotates in the first direction, which causes the resilient member 54 to generate a deformation, and the elastic force generated by the deformation is applied on the rotating lever 70. The handle 42 needs to continue to rotate to overcome the elastic force applied on the rotating lever 70. Because the distance between the first end and the rotation shaft 80 is greater than the distance between the second end and the rotation shaft 80, according to the lever principle, the force applied on the handle 42 needs to increase to overcome the elastic force, and the force applied on the handle 42 will transmit to the first electronic component 30, thereby increasing a connecting force of the first electronic component 30 on the second electronic component 40. As long as the distance between the first end and the rotation shaft 80 is sufficiently larger than the distance between the second end and the rotation shaft 80, the first electronic component 30 can connect with the second electronic component 40 without the gaps. The distance between the first end and the rotation shaft 80 and the distance between the second end and the rotation shaft 80 can be designed according to actual conditions.

In one embodiment, the handle 42 includes a fixing portion 48 connected between the two connecting portions 44. A first latching portion 45 is formed on the fixing portion 48. The first electronic component 30 includes a second latching portion (not shown) for latching with the first latching portion 45. When the handle 42 rotates until the first latching portion 45 is engaged with the second latching portion, the first electronic component 30 is connected to the second electronic component 40 without the gaps.

Since the distance between the second end and the rotation shaft 80 is smaller than the distance between the first end and the rotation shaft 80, the connection force between the first electronic component 30 and the second electronic component 40 is increased, so that the first electronic component 30 is connected to the second electronic component 40 without the gaps. Furthermore, the first electronic component 30 is fixed to the housing 20 through the rotatable second end. Therefore, a fixing position of the first electronic component 30 can be adjusted by rotating the second end.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. An electronic device comprising:
   a housing defining an accommodating space;
   a first electronic component slidable in the accommodating space;
   a second electronic component fixed in the accommodating space;
   at least one resilient assembly fixed on the housing; and
   at least one rotating lever connected to the at least one resilient assembly and rotationally fixed to the housing through a rotation shaft; wherein:
   the at least one rotating lever comprises a first end adjacent to the second electronic component and a second end opposite the first end and away from the second electronic component;
   a distance between the second end and the rotation shaft is less than a distance between the first end and the rotation shaft;
   a handle is rotationally fixed on the first electronic component;
   when the first electronic component slides into the accommodating space, the handle is rotated toward the first electronic component, the handle drives the at least one rotating lever to rotate and resist against the at least one resilient assembly, and the handle overcomes an elastic force applied by the at least one resilient assembly onto the at least one rotating lever, so that the first electronic component connects with the second electronic component without gaps;
   wherein the housing comprises a bearing plate, a top plate, and two side plates, the two side plates are fixed between the bearing plate and the top plate; the bearing plate, the top plate, and the two side plates together define the accommodating space; the first electronic component and the second electronic component are arranged between the top plate and the bearing plate; the electronic device comprises two rotating levers and two resilient assemblies; the two rotating levers and the two resilient assemblies are coupled to the two side plates, respectively.

2. The electronic device of claim 1, wherein:
   the at least one resilient assembly comprises a fixing member and a resilient member;
   the fixing member is fixed on the housing and comprises two fixing pieces spaced apart;

the resilient member is fixed between the two fixing pieces;

the first end of the rotating lever comprises a resisting member for resisting against the resilient member.

3. The electronic device of claim 2, wherein:
the resilient member is a coil spring; and
the resisting member resists a portion of the coil spring between two ends of the coil spring.

4. The electronic device of claim 2, wherein:
the at least one resilient assembly further comprises a guide post fixed between the two fixing pieces;
the resilient member is sleeved on the guide post;
the resisting member defines a through hole; and
a diameter of the through hole is larger than a diameter of the guide post.

5. The electronic device of claim 1, wherein:
the second end defines a shaft hole;
the rotation shaft is fixed on the housing; and
the rotation shaft is inserted through the shaft hole.

6. The electronic device of claim 5, wherein:
the second end comprises a connecting shaft;
the handle comprises two connecting portions facing the two side plates, respectively;
each of the two connecting portions defines a notch; and
the notch is configured to receive the connecting shaft to cause the connecting portion to resist the connecting shaft.

7. The electronic device of claim 1, wherein:
the handle comprises a latching portion;
when the handle is rotated until the latching portion latches with the first electronic component, the first electronic component is coupled to the second electronic component without gaps.

8. The electronic device of claim 1, wherein:
the distance between the first end and the rotation shaft is ten times the distance between the second end and the rotation shaft.

9. An electronic device comprising:
a housing defining an accommodating space;
a first electronic component slidable in the accommodating space;
a second electronic component fixed in the accommodating space;
at least one resilient assembly fixed on the housing; and
at least one rotating lever connected to the at least one resilient assembly and rotationally fixed to the housing through a rotation shaft; wherein:
the at least one rotating lever comprises a first end adjacent to the second electronic component and a second end opposite the first end and away from the second electronic component;
a distance between the first end and the rotation shaft is at least ten times a distance between the second end and the rotation shaft;
a handle is rotationally fixed on the first electronic component;
when the first electronic component slides into the accommodating space, the handle is rotated toward the first electronic component, the handle drives the at least one rotating lever to rotate and resist against the at least one resilient assembly, and the handle overcomes an elastic force applied by the at least one resilient assembly onto the at least one rotating lever, so that the first electronic component connects with the second electronic component without gaps;

wherein the electronic device comprises two rotating levers; the second end comprises a connecting shaft the handle comprises two connecting portions; each of the two connecting portions defines a notch; the notch is configured to receive the connecting shaft of the corresponding rotating lever to cause the connecting portion to resist the connecting shaft.

10. The electronic device of claim 9, wherein:
the housing comprises a bearing plate, a top plate, and two side plates;
the two side plates are fixed between the bearing plate and the top plate;
the bearing plate, the top plate, and the two side plates together define the accommodating space; and
the first electronic component and the second electronic component are arranged between the top plate and the bearing plate.

11. The electronic device of claim 10, wherein:
the electronic device comprises two resilient assemblies; and
the two rotating levers and the two resilient assemblies are coupled to the two side plates, respectively.

12. The electronic device of claim 11, wherein:
each of the two resilient assemblies comprises a fixing member and a resilient member;
the fixing member is fixed on the housing and comprises two fixing pieces spaced apart;
the resilient member is fixed between the two fixing pieces;
the first end of the rotating lever comprises a resisting member for resisting against the resilient member.

13. The electronic device of claim 12, wherein:
the resilient member is a coil spring; and
the resisting member resists a portion of the coil spring between two ends of the coil spring.

14. The electronic device of claim 13, wherein:
each of the two resilient assemblies further comprises a guide post fixed between the two fixing pieces;
the resilient member is sleeved on the guide post;
the resisting member defines a through hole; and
a diameter of the through hole is larger than a diameter of the guide post.

15. The electronic device of claim 14, wherein:
the second end defines a shaft hole;
the rotation shaft is fixed on the housing; and
the rotation shaft is inserted through the shaft hole.

16. The electronic device of claim 15, wherein:
the handle comprises a latching portion;
when the handle is rotated until the latching portion latches with the first electronic component, the first electronic component is coupled to the second electronic component without gaps.

* * * * *